United States Patent [19]

Hsiu

[11] Patent Number: 4,632,589

[45] Date of Patent: Dec. 30, 1986

[54] SOLDER-FREE CIRCUIT BASE PLATE

[76] Inventor: William Hsiu, 294, 11th Fl., Chang An E. Rd., Sec. 2, Taipei, 104, Taiwan

[21] Appl. No.: 802,115

[22] Filed: Nov. 25, 1985

[51] Int. Cl.⁴ .............................................. F16D 1/00
[52] U.S. Cl. ........................................ 403/24; 403/4; 403/294; 403/381
[58] Field of Search ..................... 403/294, 4, 381, 24

[56] References Cited

U.S. PATENT DOCUMENTS 2,048,380 7/1936 Hansen ............................. 403/381 X
4,564,732 1/1986 Lancaster et al. .................. 403/381

FOREIGN PATENT DOCUMENTS 278212 4/1952 Switzerland ........................ 403/381

Primary Examiner—Andrew V. Kundrat
Attorney, Agent, or Firm—Armstrong, Nikaido, Marmelstein & Kubovcik

[57] ABSTRACT

A solder-free circuit base plate made by changing the two integrated halves of conventional circuit base plate to two separate pieces side-exchangeably and removably joined by means of butterfly tenons and mortises made in the edges of different width so that different spaces and distances between the inserting holes can be arranged for making full use of the inserting holes and for inserting of different sizes of electronic parts in addition to the round hole design which smooths the insertion, prevents the hole from deforming and enhances the efficiency.

1 Claim, 13 Drawing Figures

SOLDER-FREE CIRCUIT BASE PLATE

BACKGROUND AND SUMMARY OF THE INVENTION

The conventional circuit base plate as shown in FIG. 1 comprises two fixedly joined pieces 1, 2 and two circuit connecting plates 3,4. Since the two pieces 1, 2 are fixedly joined together, the distance between the two groups of inserting holes 5, 6 is fixed and can not be adjusted to desired space for full use of the inserting holes. As shown in FIGS. 2A, 2B & 2C, a large integrated circuit (hereinafter IC) board 7 installed on the base plate covers most of the inserting holes 8. As a result, the holes left are very few and not conducive for inserting of other electronic parts. Therefore, it is frequently a cause of inconvenience during installation. The disadvantage is apparently due to the unchangeability of distance between the inserting holes 5,6, which results in a lot of holes being covered and wasted when a large IC board is installed.

In addition, the square holes 5, 6 are not suitable for use because the pins of electronic parts, which are mostly round, will meet resistance of the corners of the square holes 5,6 resulting in unsmooth insertion and deformed holes if inserting forcibly. Furthermore the joints of the two circuit connecting plates will often break when improper force is applied during disassembling.

In order to eliminate the above mentioned disadvantages of conventional circuit base plates, the inventor studies hard and developed this invention which can effectively solve the above problem.

So the main object of this invention is to provide a complete solder-less circuit base plate consisting of two separate pieces to replace the two integrated pieces of the conventional circuit base plate, and being capable of adjusting the space and distance between the two groups for inserting holes to meet the need of inserting of different sizes of IC boards and various electronic parts. In other words, it serves to enhance the efficiency of base plate and to eliminate the disadvantages of conventional solder-less circuit base plate resulted from its unchangeability of distance between the two groups of inserting holes such as waste of holes, unsmooth insertion, damage to the pins of electronic parts and deformation of the inserting holes.

Specifically, the solder-less circuit base plate of this invention changes the two integrated halves of conventional solder-less circuit base plate to two separate, side-exchangeable, removably-joined pieces which have joining edges, one wide and one narrow, on both sides of their inserting holes so that they can be joined together in three ways, i.e. joined with two wide edges, one wide edge and one narrow edge and two narrow edges, and the space and distance between the two groups of inserting holes can be adjusted to meet the need of different sizes of IC boards. Besides, round inserting holes are made and designed to attain smooth insertion and to prevent deformation.

BRIEF DESCRIPTION OF THE DRAWINGS

FIG. 2A is a top view of the conventional base plate with an IC board on.

FIG. 2B is a side view of the conventional base plate with an IC board on.

FIG. 2C is a bottom view of the conventional base plate with an IC board on.

DETAILED DESCRIPTION

Figure 1:
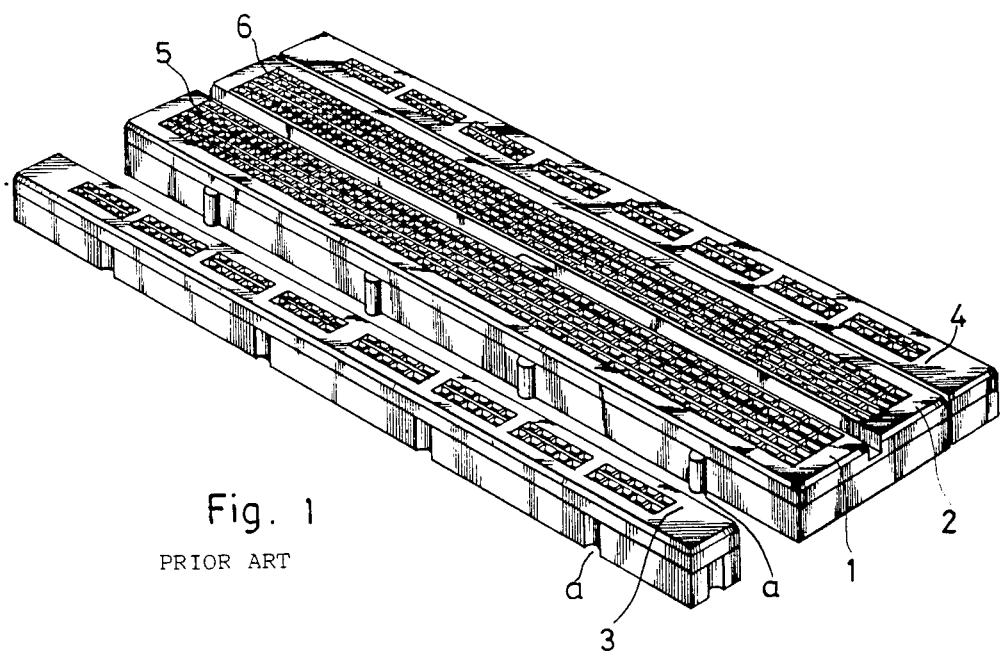
FIG. 1 is a perspective view of the conventional solder-free circuit base plate.
Figure 2A:
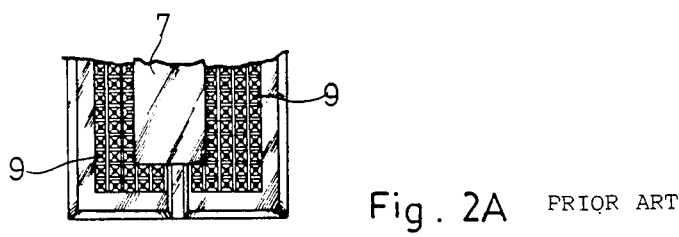
Figure 2B:
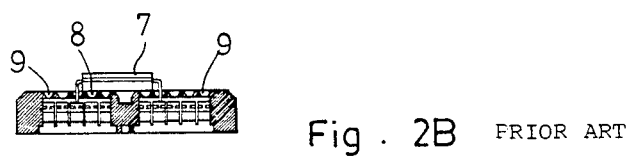
Figure 2C:
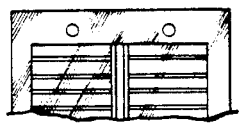
Figure 3:
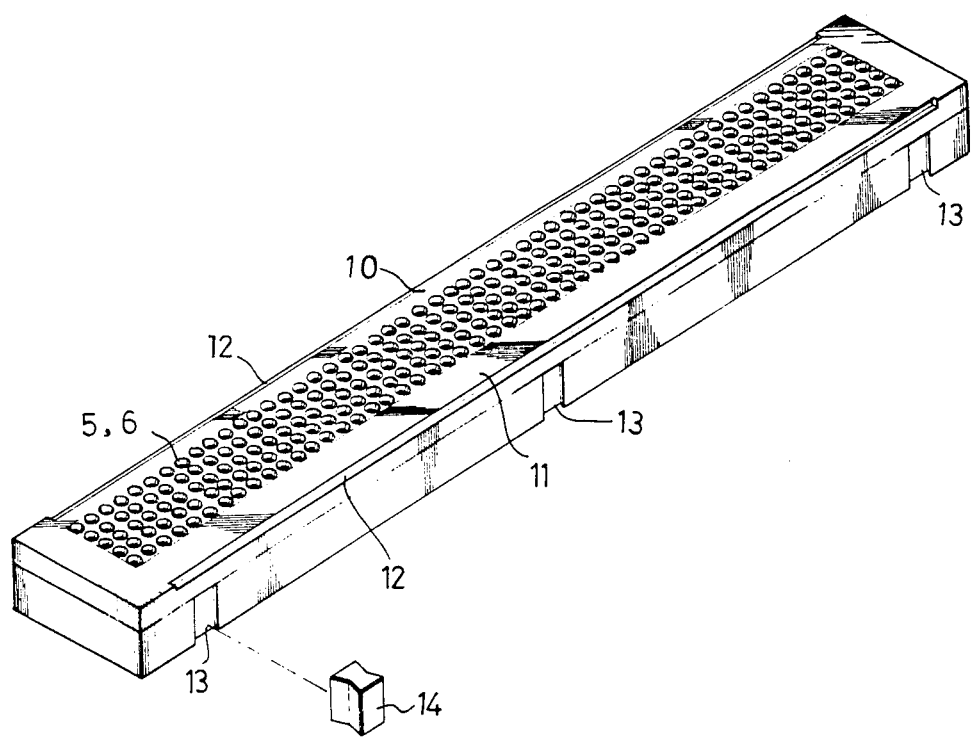
FIG. 3 is a perspective view of the solder-free circuit base plate of this invention.
Figures 5A, 5B, 5C:
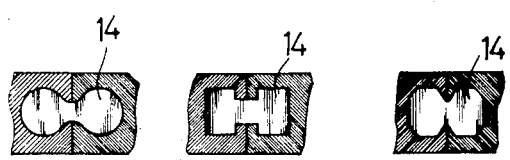
FIGS. 5A, B & C show the joints of the solder-free circuit base plates as shown in FIG. 3.

Referring now to the drawings, the novel feature of this invention is described as follows:

As shown in FIG. 3, the solder-free circuit base plate of this invention is made in two separate pieces. Each plate has joining edges 11, 10, one wide and one narrow, on both sides of the area of inserting holes 5, 6. Each of the joining edges 11, 10 has a plurality of long notches 12 to facilitate the pulling of IC board out of the holes, and a plurality of mortises 13 equidistantly distributed to receive butterfly tenons 14 to make a joint of the two separate pieces of base plate. In addition to butterfly shape as shown in FIG. 3, the mortise 13 and the tenon 14 can be made in other shapes as shown in FIGS. 5A, B & C. The mortise and tenon joints of this invention are designed to eliminate the disadvantage of the joint of conventional circuit base plates which will often break when improper force is applied in disassembling. The round holes 5, 6 of this invention are designed to match the pins of electronic parts of which more than 90 percent are round. For this reason, the invention cannot only attain smooth insertion and security but also eliminate the disadvantages of conventional solder-less circuit base plates of which the square holes are difficult for inserting, easy to cause damage to the pins and apt to deform.

Figure 4A:
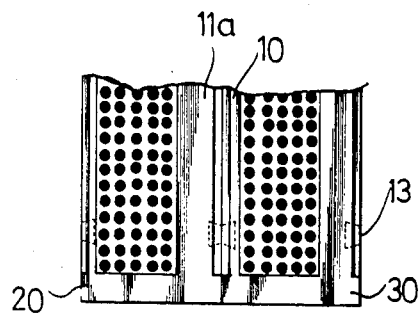
FIGS. 4A, B & C illustrate the application of the solder-free circuit base plate as shown in FIG. 3.
Figure 4B:
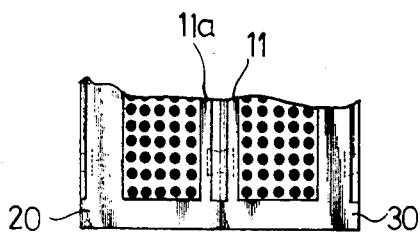
Figure 4C:
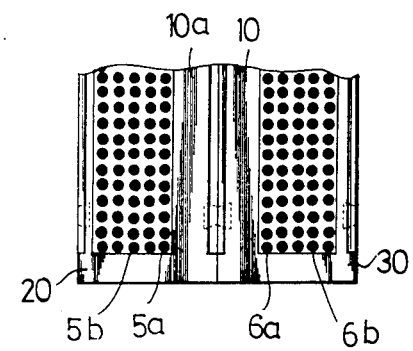
Figure 6B:
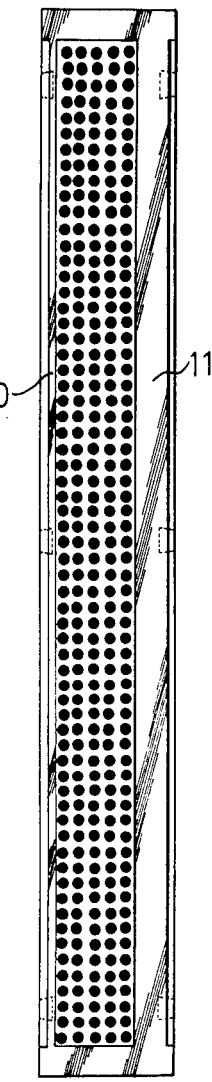
FIG. 6B is a top view of the solder-less circuit base plate of this invention.
Figure 6A:
FIG. 6A is a cross section of the solder-less circuit base plate of this invention.

As shown in FIGS. 4A, B & C, two similar pieces 20, 30 of base plate are joined in three ways. FIG. 4A shows the joint of a wide edge and a narrow edge 10, 11a. FIG. 4B shows the joint of two narrow edges 11, 11a suitable for IC board with pins at short distance. FIG. 4C shows the joint of two wide edges 10, 10a suitable for IC board with pins at long distance. In application, the distance between the two groups of holes 5, 6 may be arranged as shown in FIG. 4C. The pins of IC board can be inserted in the holes 5a, 6a so that relatively few holes will be covered by the board and the holes 5b, 6b left can be used for other electronic parts. (Conventional base plates have no such advantage.) For smaller IC board, it can be assembled as shown in FIG. 4B. So different arrangements can be made for different electronic parts. Obviously, it is much convenient than conventional base plates.

What is claimed is:

1. A solder-less circuit base plate for the mounting of integrated circuit boards comprising at least two rectangular plates having a top surface into which are formed a plurality of cylindrical insertion holes arranged in a grid pattern, notched formed into said plates at the junction of the top and the long sides, borders between said grid of said insertion holes and the edges of said plate, said border being wider on one long side of said plate then on the other long side, and a plurality of mortises formed in the long sides of said plate, whereby butterfly tennons inserted into said mortises join individual plates together and whereby the distances between said grids can be adjusted by selection of the width of the adjacent margins.

* * * * *